(12) United States Patent
Cariello

(10) Patent No.: US 12,354,638 B2
(45) Date of Patent: Jul. 8, 2025

(54) SIGNALING MEMORY ZONE RANKING INFORMATION

(71) Applicant: Micron Technology, Inc., Boise, ID (US)

(72) Inventor: Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 124 days.

(21) Appl. No.: 18/204,202

(22) Filed: May 31, 2023

(65) Prior Publication Data
US 2023/0395117 A1 Dec. 7, 2023

Related U.S. Application Data

(60) Provisional application No. 63/365,688, filed on Jun. 1, 2022.

(51) Int. Cl.
*G11C 11/00* (2006.01)
*G11C 11/406* (2006.01)

(52) U.S. Cl.
CPC .. *G11C 11/40615* (2013.01); *G11C 11/40622* (2013.01)

(58) Field of Classification Search
CPC ... G06F 9/50; G06F 3/06; G06F 12/10; G06F 16/182; G06F 3/048; G06F 9/455; G06F 11/07; G06F 11/10; G06F 11/30; G06F 12/02; G06F 9/30; G05B 15/02; G11C 11/406; G06Q 10/04; G06Q 10/06; G06Q 30/02
See application file for complete search history.

(56) References Cited

U.S. PATENT DOCUMENTS 11,468,099 B2 * 10/2022 Ziauddin ............ G06F 16/221

\* cited by examiner

*Primary Examiner* — Thong Q Le
(74) *Attorney, Agent, or Firm* — Holland & Hart LLP

(57) ABSTRACT

Methods, systems, and devices for signaling memory zone ranking information are described. A first system may determine ranking information for zones of a memory. The ranking information may be associated with a first type of maintenance operation. The first system may transmit the ranking information to a second system. The second system may use the ranking information to manage a second type of maintenance operation.

20 Claims, 10 Drawing Sheets

SIGNALING MEMORY ZONE RANKING INFORMATION

CROSS REFERENCE

The present application for patent claims the benefit of U.S. Provisional Patent Application No. 63/365,688 by Cariello et al., entitled "SIGNALING MEMORY ZONE RANKING INFORMATION," filed Jun. 1, 2022, assigned to the assignee hereof, and expressly incorporated by reference herein.

FIELD OF TECHNOLOGY

The following relates to one or more systems for memory, including signaling memory zone ranking information.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory system may include one or more memory arrays that are divided (e.g., logically) into zones of memory cells for access operations and maintenance operations. For example, a memory system may perform maintenance operations, such as refresh operations and garbage collection operations, on a zone-by-zone basis. A refresh operation may refer to an operation in which the data (e.g., both valid data and invalid data) in a zone is re-written to the zone or copied to another zone. A garbage collection operation may refer to an operation in which valid data from a zone is copied to another zone (e.g., so that the original zone can be erased). A memory system may use refresh operations to improve data retention and reliability and may use garbage collection operations to free up zones for new data.

In some systems, such as zoned namespace (ZNS) systems, management of maintenance operations may be split between the memory system and a host system. For example, the memory system may initiate refresh operations based on various maintenance information determined by the memory system, and the host system may initiate garbage collection operations based on validity information determined by the host system. But in some examples, the maintenance operations initiated by one system may be redundant or superfluous in light of maintenance operations initiated by the other system. For example, the memory system may perform a refresh operation on a zone right before the host system initiates a garbage collection operation on the zone (which may inherently refresh the data of the zone). Performing unnecessary or superfluous maintenance operations may waste resources and increase latency of the system, among other disadvantages.

According to the techniques described herein, a first system (e.g., a memory system, a host system) may transmit, to a second system (e.g., a memory system, a host system), information that indicates a ranking of zones. In some examples, the information may explicitly indicate the ranking (e.g., predicted order) of zones for a type of operation (e.g., maintenance operation). For instance, a memory system may indicate the refresh ranking for zones, or the host system may indicate the garbage collection ranking for zones. In other examples, the information may indicate, for example, maintenance information, validity information, data access information, for the zones that implicitly indicates the ranking of the zones for a type of operation. The system that receives the information may use the information (which may be associated with one type of operation) to prioritize a different type of operation. Thus, unnecessary or superfluous operations may be avoided, which may improve the performance of the system.

Figure 1:
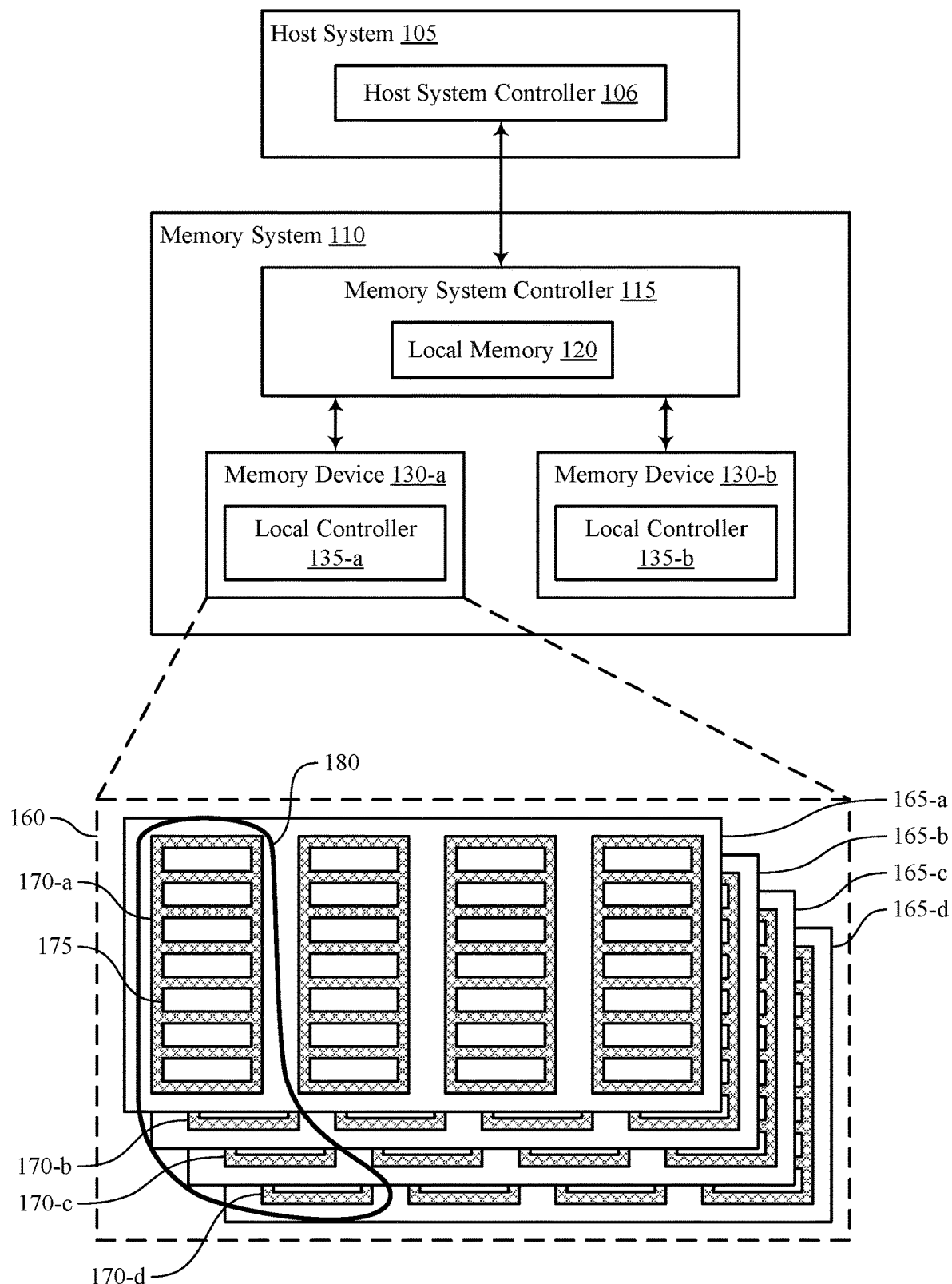
FIG. 1 illustrates an example of a system that supports signaling memory zone ranking information in accordance with examples as disclosed herein.
Figure 2:
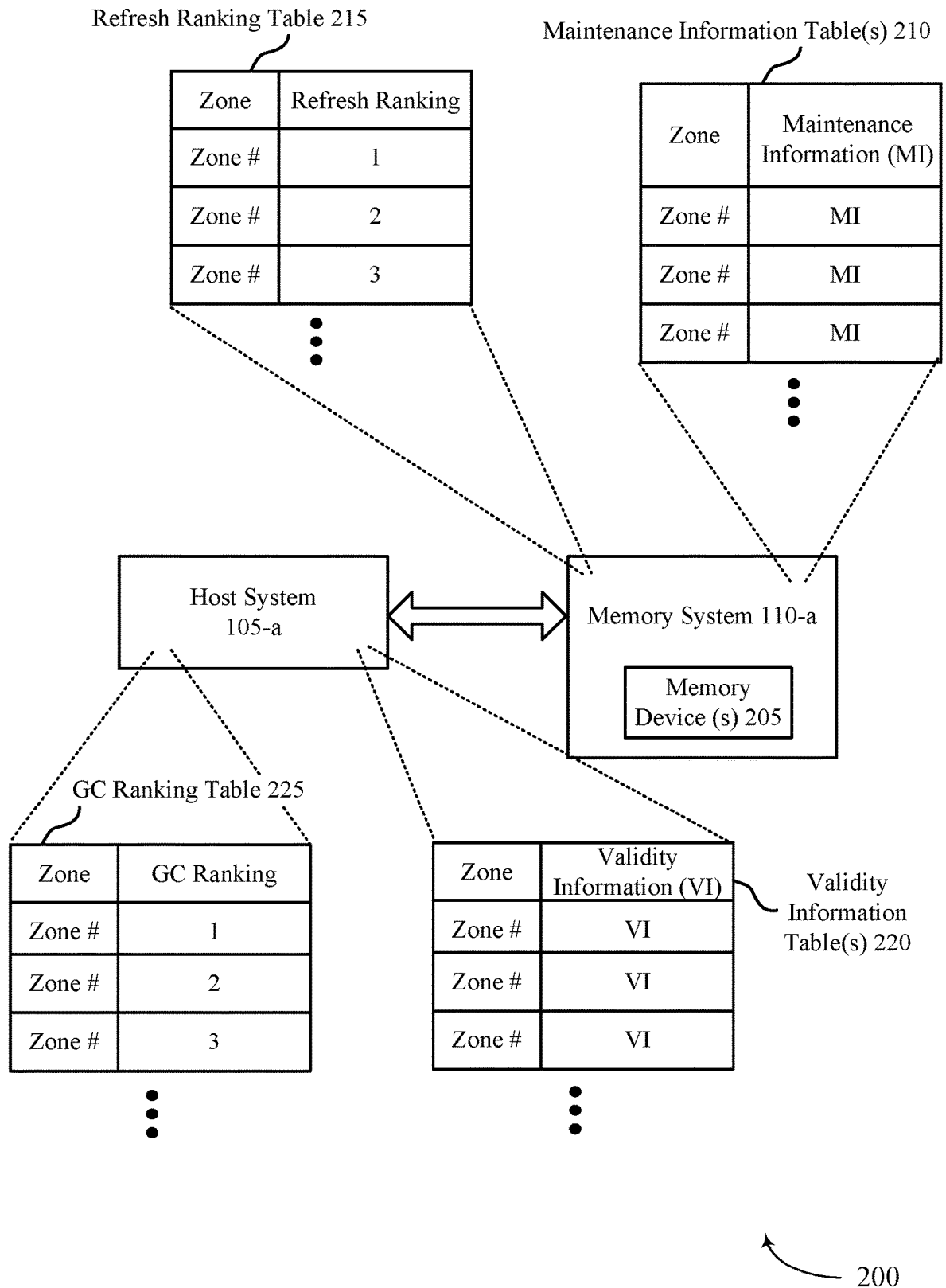
FIG. 2 illustrates an example of a system that supports signaling memory zone ranking information in accordance with examples as disclosed herein.

Features of the disclosure are initially described in the context of systems, devices, and circuits with reference to FIGS. 1 through 2. Features of the disclosure are described in the context of process flows with reference to FIGS. 3 and 4. These and other features of the disclosure are further illustrated by and described in the context of an apparatus diagram and flowchart that relate to signaling memory zone ranking information with reference to FIGS. 5 through 10.

FIG. 1 illustrates an example of a system 100 that supports signaling memory zone ranking information in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

Although described with reference to blocks 170, garbage collection operations may be performed on a zone basis, which may be the same size or a different size relative to a block 170. Thus, in a ZNS system, performing a garbage collection operation may include copying valid data from one zone to a different zone.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples (e.g., in a ZNS system), the memory cells of the memory dies 160 may be divided into zones for access and maintenance. For example, the memory system 110 may perform refresh operations and garbage collection operations on a zone-by-zone basis. A zone may include a range of memory cells (e.g., a range of physical addresses) and may be the same size as a block 170 or a different size. Data stored in the physical addresses of a zone may be mapped to LBAs via the L2P table. In some cases, the memory system 110 may reduce at least a portion of the L2P table by mapping one or more zones to corresponding LBAs.

The memory system 110 may perform maintenance operations on a per-zone basis. For example, the memory system 110 may perform refresh operations on a per-zone basis and garbage collection operation on a per-zone basis.

A refresh operation may increase the reliability of data that might otherwise become corrupted. For example, data in a zone may become corrupted if the zone (or a nearby zone) is accessed (e.g., read) a threshold quantity of times in between writing or refreshing the zone, a phenomenon which may be referred to as read disturb. In another example, data in a zone may become corrupted if a threshold amount of time elapses in between writing or refreshing the zone. In another example, data in a zone may become corrupted (or may be misread) if the difference between the write temperature (e.g., the temperature measured during a write operation) and the read temperature (e.g., the temperature measured during a read operation) for the zone is greater than a threshold.

To increase the reliability of data in a zone, the memory system 110 may perform a refresh operation on the zone. In one example, performing a refresh operation may include re-writing the data (e.g., both valid data and invalid data) in a zone to the same zone. In another example, performing a refresh operation may include copying the data (e.g., both valid data and invalid data) from one zone to a different zone. Valid data may refer to data that is up-to-date and invalid data may refer to data that is out-of-date (e.g., not associated with an entry in the L2P table).

In addition to performing refresh operations, the memory system 110 may also perform garbage collection operations. Garbage collection operations may be used to free up zones for new data. The host system 105 may initiate a garbage collection operation on a zone based on the validity status of data in the zone. For example, the host system 105 may initiate a garbage collection operation on a zone if the zone has a threshold quantity of invalid data, or a threshold ratio of invalid data to valid data. Thus, the host system 105 may manage garbage collection operations based on validity information for zones of the memory system 110, where validity information indicates the validity status of data in the zone.

In some cases, the memory system 110 may manage refresh operations and the host system 105 may manage garbage collection operations. But the memory system 110 and the host system 105 may be unaware of the other system's management, which may result in the memory system 110 performing superfluous or unnecessary maintenance operations. For example, the host system 105 may initiate a garbage collection operation on a zone (the performance of which may naturally refresh the valid data of the zone) soon after the memory system 110 has already performed a refresh operation on the zone. Thus, the memory system 110 may perform superfluous or unnecessary operations, which may negatively impact the performance of the system 100.

According to the techniques described herein, the host system 105 and the memory system 110 may exchange information for different types of operations so that each system can account for the other system's operations as part of managing its own operations. For instance, the host system 105 may provide ranking information associated with garbage collection operations so that the memory system 110 can prioritize zones for other operations. To illustrate, if the ranking information from the host system 105 indicates that a zone has a high urgency for garbage collection, the memory system 110 may deprioritize that zone for refresh to avoid a superfluous refresh operation on the zone. Additionally or alternatively, the memory system 110 may provide ranking information associated with refresh operations so that the host system 105 can prioritize zones for garbage collection operations. To illustrate, if the ranking information from the memory system 110 indicates that a zone has a high urgency for refresh, the host system 105 may prioritize that zone for garbage collection to avoid a superfluous refresh operation on the zone.

The system 100 may include any quantity of non-transitory computer readable media that support signaling memory zone ranking information. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

FIG. 2 illustrates an example of a system 200 that supports signaling memory zone ranking information in accordance with examples as disclosed herein. The system 200 may be an example of a system 100 as described with reference to FIG. 1 or aspects thereof. The system 200 may include a host system 105-a that is configured to manage garbage collection operations and a memory system 110-a that is configured to manage refresh operations. The host system 105-a and the memory system 110-a may be examples of the host system 105 and the memory system 110, respectively. According to the techniques described herein, the host system 105-a and the memory system 110-a may exchange ranking information and manage maintenance operations based on the ranking information.

The memory system 110-a may include one or more memory device(s) 205, which may include sets of memory cells grouped (e.g., logically) into zones. To manage operations (e.g., maintenance operations) for the zones, the memory system 110-a may track (e.g., monitor, record) information for the zones. For example, the memory system 110-a may track read disturb information for the zones, where the read disturb information for a zone indicates a quantity of read operations performed on the zone (or on a neighboring zone) since performance of a write operation or a refresh operation on the zone. In another example, the memory system 110-a may track retention status information for the zones, where the retention status information for a zone indicates a duration of time since performance of a write operation or a refresh operation on the zone. In another example, the memory system 110-a may track temperature information for the zones, where the temperature information for a zone indicates a write temperature (e.g., a maximum write temperature) for the zone or a difference between a write temperature and a current or nominal temperature. Other types of maintenance information are contemplated and within the scope of the present disclosure.

The memory system 110-a may track information on a zone-by-zone basis so that the memory system 110-a can initiate maintenance operations (e.g., refresh operations) on a zone-by-zone basis. In some examples, the memory system 110-a may track the maintenance information (MI) using one or more tables (e.g., one or more maintenance information table(s) 210). The maintenance information table(s) 210 may be stored in the memory device(s) 205, in volatile memory (e.g., a local memory 120), or both.

In some examples, a maintenance information table 210 may be arranged so that the zones are ranked in order of refresh urgency based on the maintenance information tracked by that table. For instance, if a maintenance information table 210 is tracking read disturb information, the maintenance information table 210 may list the zones in descending order of quantity of read operations (e.g., zones associated with higher quantities of read operations may be ranked higher than zones associated with lower quantities of read operations). If a maintenance information table 210 is tracking retention status information, the maintenance information table 210 may list the zones in descending order of duration (e.g., zones associated with longer durations of time may be ranked higher than zones associated with shorter durations of time). If a maintenance information table 210 is tracking temperature information, the maintenance information table 210 may list the zones in descending order of gradient (e.g., zones associated with more extreme temperatures, determined relative to a baseline temperature, may be ranked higher than zones associated with less extreme temperatures).

In some examples, the memory system 110-a may use a combination of maintenance information to rank zones for the refresh ranking table 215, which may indicate a predicted order for performing refresh operations. Put another way, the refresh ranking table 215 may indicate zones in descending order of refresh urgency, where zones with higher refresh urgency are ranked higher than zones with lower refresh urgency. The ranking indicated by refresh ranking table 215 may be based on a combination of maintenance information. For example, the refresh ranking may be based on read disturb information, retention status information, temperature information, or any combination thereof, among other types of maintenance information. The maintenance information may be combined according to weighting factors, in some cases.

Thus, the memory system 110-a may maintain a quantity of tables for managing maintenance operations such as refresh operations.

To manage operations (e.g., garbage collection operations) for the zones, the host system 105-a may track information for the zones. For example, the host system 105-a may track validity information for the zones, where the validity information for a zone indicates a quantity of invalid data in the zone, a quantity of valid data in the zone, a ratio of invalid and valid data in the zone, or any combination thereof.

The host system 105-a may track information on a zone-by-zone basis so that the host system 105-a can initiate maintenance operations (e.g., garbage collection operations) on a zone-by-zone basis. In some examples, the host system 105-a may track the information using one or more tables (e.g., one or more validity information table(s) 220).

In some examples, a validity information table 220 may be arranged so that the zones are ranked in order of garbage collection urgency based on the validity information (VI) tracked by that table. For instance, if a validity information table 220 is tracking the quantity of invalid data per zone, the validity information table 220 may list the zones in descending order of quantity of invalid data (e.g., zones associated with higher quantities of invalid data may be ranked higher than zones associated with lower quantities of invalid data). If a validity information table 220 is tracking the quantity of valid data per zone, the validity information table 220 may list the zones in ascending order of quantity of valid data (e.g., zones associated with lower quantities of valid data may be ranked higher than zones associated with higher quantities of valid data). If a validity information table 220 is tracking the ratio of invalid data to valid data per zone, the validity information table 220 may list the zones in descending order of ratio value (e.g., zones associated with higher ratio values may be ranked higher than zones associated with lower ratio values).

In some examples, the host system 105-a may use the validity information to rank zones for the garbage collection (GC) ranking table 225, which may indicate a predicted order for initiating garbage collection operations. Put another way, the garbage collection ranking table 225 may indicate zones in descending order of garbage collection urgency, where zones with higher garbage collection urgency are ranked higher than zones with lower garbage collection urgency. As noted, the ranking indicated by garbage collection ranking table 225 may be based on maintenance information such as validity information. For example, the garbage collection ranking may be based on the quantity of invalid data per zone, the quantity of valid data per zone, or the ratio of invalid data to valid data per zone.

Thus, the host system 105-a may maintain a quantity of tables for managing maintenance operations such as garbage collection operations.

In some examples, one or both of the host system 105-a and the memory system 110-a may transmit ranking information to the other system. For example, the memory system 110-a may transmit ranking information (e.g., ranking information from the maintenance information table(s) 210, ranking information from the refresh ranking table 215) that indicates (explicitly or implicitly) the refresh ranking for a set of zones. For instance, the memory system 110-a may transmit ranking information for a quantity of zones (e.g., x zones, where x is an integer) with the highest refresh ranking. The host system 105-a may then use the ranking information from the memory system 110-a to manage garbage collection operations. For example, the host system 105-a may prioritize or deprioritize zones for garbage collection by updating (e.g., adjusting) the garbage collection ranking table 225.

In another example, the host system 105-a may transmit ranking information (e.g., ranking information from the validity information table(s) 220, ranking information from the garbage collection ranking table 225) that indicates (explicitly or implicitly) the garbage collection ranking for a set of zones. For instance, the host system 105-a may transmit ranking information for a quantity of zones (e.g., y zones, where y is an integer) with the highest garbage collection ranking. The memory system 110-a may then use the ranking information from the host system 105-a to manage refresh operations. For example, the memory system 110-a may prioritize or deprioritize zones for refresh by updating (e.g., adjusting) the refresh ranking table 215.

Thus, the host system 105-a and the memory system 110-a may exchange ranking information and manage maintenance operations based on the ranking information.

Figure 3:
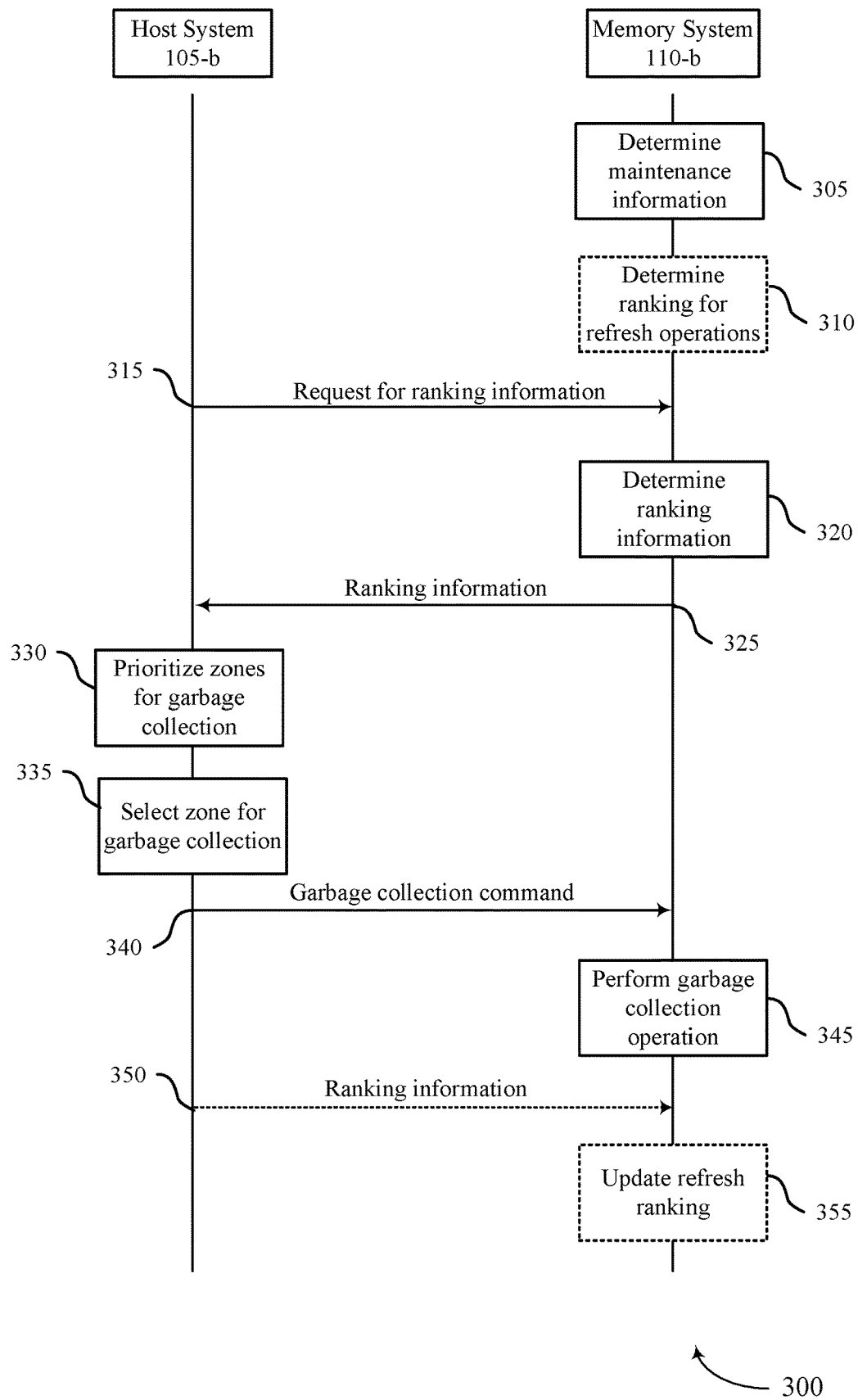
FIG. 3 illustrates an example of a process flow that supports signaling memory zone ranking information in accordance with examples as disclosed herein.

FIG. 3 illustrates an example of a process flow 300 that supports signaling memory zone ranking information in accordance with examples as disclosed herein. The process flow 300 may be implemented by a host system 105-b and a memory system 110-b, which may be examples of a host system and memory system, respectively, as described herein. By implementing the process flow 300, the systems may improve maintenance operation management and avoid superfluous maintenance operations, among other advantages.

Aspects of the process flow 300 may be implemented by a controller, among other components. Additionally or alternatively, aspects of the process flow 300 may be implemented as instructions stored in memory (e.g., firmware stored in a memory coupled with the host system 105-b or the memory system 110-b). For example, the instructions, if executed by a controller (e.g., the host system controller 106, the memory system controller 115) may cause the controller to perform the operations of the process flow 300.

At 305, information (e.g., maintenance information) may be determined (e.g., by the memory system 110-b). For example, the memory system 110-b may determine read disturb information for a set of zones, retention status information for the set of zones, temperature information for the set of zones, or any combination thereof, among other types of maintenance information. At 310, a ranking for a first type of operation (e.g., a refresh operation) may be determined (e.g., by the memory system 110-b). The ranking may be determined based on the maintenance information and may indicate a refresh urgency or predicted order of refresh for the set of zones.

At 315, a request for ranking information may be transmitted (e.g., by the host system 105-b). Although shown occurring at 315, the request may be received before or after the ranking is determined at 310. At 320, ranking information for a subset of the zones may be determined (e.g., by the memory system 110-b). The ranking information for the subset of zones may be determined in response to the request transmitted at 315 and may be based on the maintenance information determined at 305, the ranking determined at 310, or both. The ranking information may indicate the x zones with the highest refresh urgency. Put another way, the ranking information may indicate the x zones most likely to undergo a refresh operation.

At 325, the ranking information for the subset of zones (e.g., the x zones) may be transmitted (e.g., by the memory system 110-b). The ranking information may be transmitted based on (e.g., in response to) the request at 315. The ranking information may be maintenance information that implicitly indicates the x zones with the highest refresh urgency (e.g., the ranking information may be read disturb information, retention status information, temperature information) or the ranking information may explicitly indicate the x zones with the highest refresh urgency (e.g., the ranking information may indicate the refresh ranking of the x zones). The ranking information may be indicated using descriptors, using an interface (e.g., a vital product data (VPD) interface), or using buffer commands (e.g., write buffer commands, read buffer commands), among other examples. For example, the host system 105-b may read descriptors of the memory system 110-b to retrieve the ranking information. The descriptors may be sorted according to the ranking information, such that reading a set of descriptors may provide the zones with the highest ranked information of the ranking information. In another example, the host system 105-b may send read buffer commands reading portions of a buffer including the ranking information. The buffer may be sorted according to the ranking information.

At 330, a second type of maintenance operation may be prioritized (e.g., by the host system 105-b) based on the ranking information. For example, the host system 105-b may update (e.g., adjust) the garbage collection ranking for a subset of zones based on the ranking information from the memory system 110-b. In one example, the host system 105-b may deprioritize (e.g., reduce the ranking of) a zone based on the zone being excluded from the x zones indicated by the ranking information (e.g., because the zone is not at risk of undergoing redundant maintenance operations). In another example, the host system 105-b may prioritize (e.g., increase the ranking of) a zone based on the zone being included in the x zones indicated by the ranking information (e.g., because the zone is at risk of undergoing redundant maintenance operations).

At 335, a zone may be selected (e.g., by the host system 105-b) for the second type of maintenance operation (e.g., a garbage collection operation). The host system 105-b may select the zone based on the prioritization of the zones at 330. In some examples, the host system 105-b may select the zone based on the zone being included in the x zones indicated by the ranking information. At 340, a command instructing the memory system 110-b to perform a garbage collection operation on the zone may be transmitted (e.g., by the host system 105-b). At 345, the garbage collection operation may be performed on the zone (e.g., by the memory system 110-b). The garbage collection operation may be performed based on (e.g., in response to) the command at 340. Performing the garbage collection operation may include copying valid data from the zone to a different zone (e.g., reading the valid data from the zone and writing the valid data to the different zone).

At 350, ranking information for the second type of maintenance operation (e.g., garbage collection) may be transmitted (e.g., by the host system 105-b). The ranking information may indicate a garbage collection urgency or predicted order of garbage collection for a set of zones. The ranking information may be indicated using descriptors, using an interface (e.g., a VPD interface), or using buffer commands (e.g., write buffer commands, read buffer commands), among other examples. For example, the host system 105-b may write descriptors of the memory system 110-b to provide the ranking information, or the host system 105-b may send write buffer commands writing portions of a buffer including the ranking information.

At 355, the ranking for the first type of maintenance operation (e.g., refresh) may be updated (e.g. by the memory system 110-b). The refresh ranking may be updated (e.g., adjusted) based on performance of the garbage collection operation, based on garbage collection ranking information, or both. For example, the memory system 110-b may deprioritize (e.g., decrease the ranking of) the zone upon which the garbage collection was performed. Additionally or alternatively, the memory system 110-b may update the ranking to deprioritize zones that have a high garbage collection urgency as indicated by the ranking information received at 350.

Thus, the host system 105-b and the memory system 110-b may improve maintenance operation management and avoid superfluous maintenance operations, among other advantages. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 4:
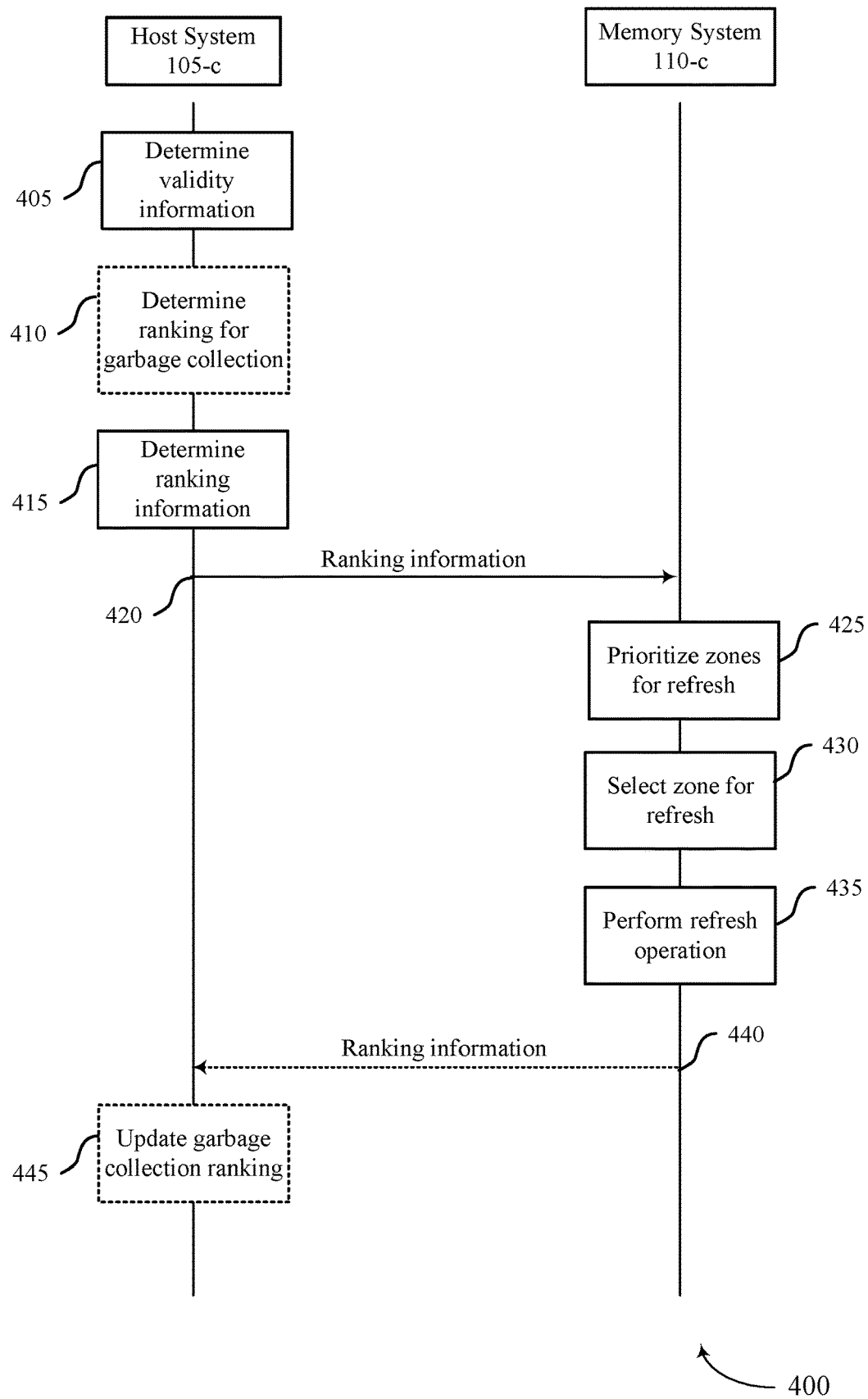
FIG. 4 illustrates an example of a process flow that supports signaling memory zone ranking information in accordance with examples as disclosed herein.

FIG. 4 illustrates an example of a process flow 400 that supports signaling memory zone ranking information in accordance with examples as disclosed herein. The process flow 400 may be implemented by a host system 105-c and a memory system 110-c, which may be examples of a host system and memory system, respectively, as described herein. By implementing the process flow 400, the systems may improve maintenance operation management and avoid superfluous maintenance operations, among other advantages.

Aspects of the process flow 400 may be implemented by a controller, among other components. Additionally or alternatively, aspects of the process flow 400 may be implemented as instructions stored in memory (e.g., firmware stored in a memory coupled with the host system 105-c or the memory system 110-c). For example, the instructions, if executed by a controller (e.g., the host system controller 106, the memory system controller 115) may cause the controller to perform the operations of the process flow 400.

At 405, information (e.g., maintenance information) may be determined (e.g., by the host system 105-c). For example, the host system 105-c may determine validity information for a set of zones of the memory system 110-c. At 410, a ranking for a first type of operation (e.g., a garbage collection operation) may be determined (e.g., by the host system 105-c). The ranking may be determined based on the validity information and may indicate a garbage collection urgency or predicted order of garbage collection for the set of zones.

At 415, ranking information for a subset of the zones may be determined (e.g., by the host system 105-c). The ranking information for the subset of zones may be based on the validity information determined at 405, the ranking determined at 410, or both. The ranking information may indicate they zones with the highest garbage collection urgency. Put another way, the ranking information may indicate they zones most likely to be selected for a garbage collection operation.

At 420, the ranking information for the subset of zones (e.g., they zones) may be transmitted (e.g., by the host system 105-c). The ranking information may be validity information that implicitly indicates they zones with the highest garbage collection urgency (e.g., the ranking information may be validity information) or the ranking information may explicitly indicate they zones with the highest garbage collection urgency (e.g., the ranking information may indicate the garbage collection ranking of they zones). The ranking information may be indicated using descriptors, using an interface (e.g., a VPD interface), or using buffer commands (e.g., write buffer commands, read buffer commands), among other examples. For example, the host system 105-*b* may write descriptors of the memory system 110-*b* to provide the ranking information, or the host system 105-*b* may send write buffer commands writing portions of a buffer including the ranking information.

At 425, a second type of maintenance operation (e.g., a refresh operation) may be prioritized (e.g., by the memory system 110-*c*) based on the ranking information. For example, the memory system 110-*c* may update the refresh ranking for a subset of zones based on the ranking information from the host system 105-*c*. In one example, the memory system 110-*c* may deprioritize (e.g., reduce the ranking of) a zone based on the zone being included in they zones indicated by the ranking information (e.g., because the zone is at risk of undergoing redundant maintenance operations). In another example, the memory system 110-*c* may prioritize (e.g., increase the ranking of) a zone based on the zone being excluded from they zones indicated by the ranking information (e.g., because the zone is not at risk of undergoing redundant maintenance operations).

At 430, a zone may be selected (e.g., by the memory system 110-*c*) for the second type of maintenance operation (e.g., a refresh operation). The memory system 110-*c* may select the zone based on the prioritization of the zones at 425. In some examples, the memory system 110-*c* may select the zone based on the zone being excluded from they zones indicated by the ranking information. At 435, the refresh operation may be performed on the zone (e.g., by the memory system 110-*c*). The refresh operation may be performed based on the selection of the zone at 430.

At 440, ranking information for the second type of maintenance operation (e.g., refresh) may be transmitted (e.g., by the memory system 110-*c*). The ranking information may indicate a refresh urgency or predicted order of refresh for a set of zones. The ranking information may be indicated using descriptors, using an interface (e.g., a VPD interface), or using buffer commands (e.g., write buffer commands, read buffer commands), among other examples. For example, the host system 105-*b* may read descriptors of the memory system 110-*b* to retrieve the ranking information, or the host system 105-*b* may send read buffer commands reading portions of a buffer including the ranking information.

At 445, the ranking for the first type of maintenance operation (e.g., garbage collection) may be updated (e.g. by the host system 105-*c*). The garbage collection ranking may be updated based on the refresh ranking information. For example, the host system 105-*c* may update the garbage collection ranking to prioritize zones that have a high refresh urgency as indicated by the ranking information received at 440.

Thus, the host system 105-*c* and the memory system 110-*c* may improve maintenance operation management and avoid superfluous maintenance operations, among other advantages. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 5:
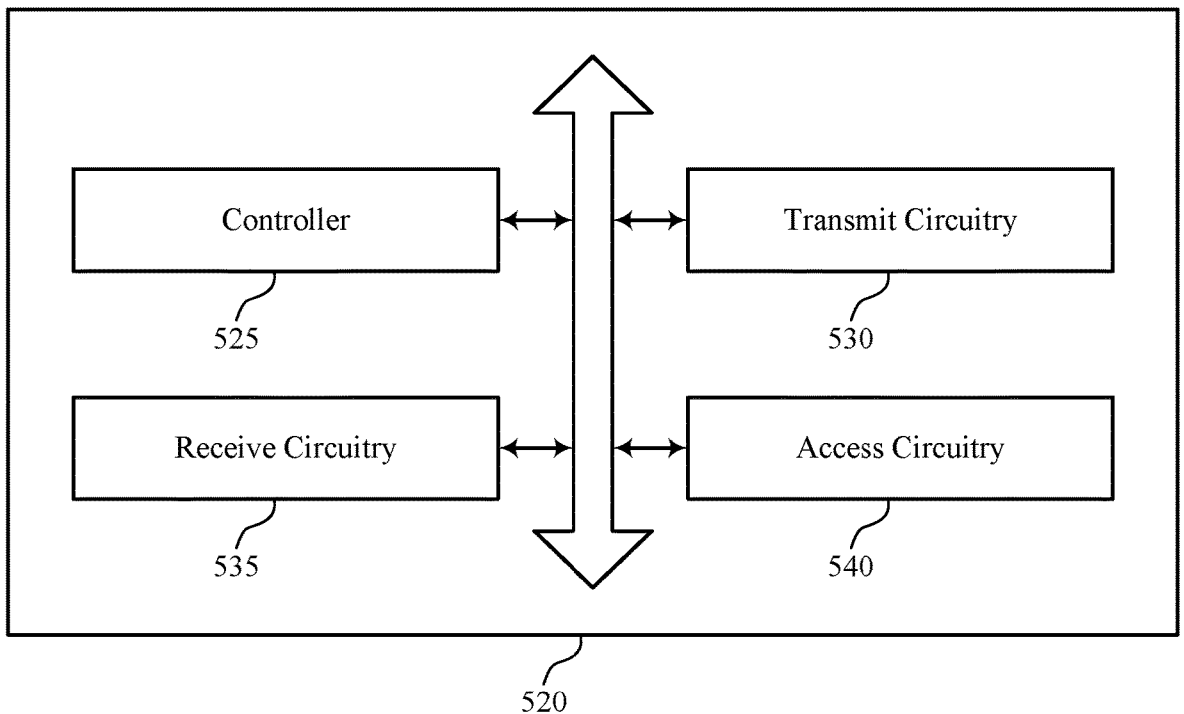
FIG. 5 shows a block diagram of a memory system that supports signaling memory zone ranking information in accordance with examples as disclosed herein.

FIG. 5 shows a block diagram 500 of a memory system 520 that supports signaling memory zone ranking information in accordance with examples as disclosed herein. The memory system 520 may be an example of aspects of a memory system as described with reference to FIGS. 1 through 4. The memory system 520, or various components thereof, may be an example of means for performing various aspects of signaling memory zone ranking information as described herein. For example, the memory system 520 may include a controller 525, a transmit circuitry 530, a receive circuitry 535, an access circuitry 540, or any combination thereof. Each of these components may communicate, directly or indirectly, with one another (e.g., via one or more buses).

The controller 525 may be configured as or otherwise support a means for determining maintenance information for a plurality of zones of a memory system that includes a memory device, where each zone of the plurality of zones includes memory cells corresponding to a respective set of addresses. In some examples, the controller 525 may be configured as or otherwise support a means for determining a ranking of the plurality of zones for a first type of maintenance operation based at least in part on the maintenance information for the plurality of zones. The transmit circuitry 530 may be configured as or otherwise support a means for transmitting ranking information for at least a subset of the plurality of zones, where the ranking information indicates the ranking of the at least the subset of the plurality of zones. The receive circuitry 535 may be configured as or otherwise support a means for receiving a command to perform a second type of maintenance operation on a zone of the plurality of zones based at least in part on transmitting the ranking information.

In some examples, the first type of maintenance operation includes a refresh operation in which data from a zone is re-written to the zone or written to another zone. In some examples, the second type of maintenance operation includes a garbage collection operation in which valid data from a zone is written to a different zone.

In some examples, the ranking information indicates a predicted order for performing the first type of maintenance operation on the plurality of zones.

In some examples, the receive circuitry 535 may be configured as or otherwise support a means for receiving a request for the ranking information, where the ranking information is transmitted based at least in part on receiving the request.

In some examples, the request for the ranking information is received after determining the ranking of the plurality of zones.

In some examples, the access circuitry 540 may be configured as or otherwise support a means for performing the second type of maintenance operation on the zone based at least in part on receiving the command. In some examples, the controller 525 may be configured as or otherwise support a means for adjusting a ranking of the zone for the first type of maintenance operation based at least in part on performing the second type of maintenance operation.

In some examples, the maintenance information for a zone includes read disturb information that indicates a quantity of read operations performed on the zone since performance of a write operation or a refresh operation on the zone, retention status information that indicates a duration of time since performance of a write operation or a refresh operation on the zone, temperature information that indicates a temperature for a write operation performed on the zone, or a combination thereof.

In some examples, the receive circuitry 535 may be configured as or otherwise support a means for receiving second ranking information for at least a second subset of the plurality of zones, the second ranking information for the second type of maintenance operation. In some examples, the controller 525 may be configured as or otherwise support a means for updating the ranking of the plurality of zones for the first type of maintenance operation based at least in part on the second ranking information.

In some examples, the receive circuitry 535 may be configured as or otherwise support a means for receiving ranking information for at least a subset of a plurality of zones of a memory system that includes a memory device, where each zone of the plurality of zones includes memory cells corresponding to a respective set of addresses. In some examples, the controller 525 may be configured as or otherwise support a means for determining a ranking of the subset of the plurality of zones for a first type of maintenance operation based at least in part on the ranking information. In some examples, the controller 525 may be configured as or otherwise support a means for selecting a zone of the plurality of zones for a second type of maintenance operation based at least in part on the ranking of the subset of the plurality of zones. The access circuitry 540 may be configured as or otherwise support a means for performing the second type of maintenance operation on the zone based at least in part on selecting the zone for the second type of maintenance operation.

In some examples, the ranking information indicates a predicted order for performing the first type of maintenance operation on the subset of the plurality of zones. In some examples, the ranking information includes validity information that indicates, for each zone of the subset of the plurality of zones, an amount data with a first validity status.

In some examples, the controller 525 may be configured as or otherwise support a means for updating a ranking of the plurality of zones for the second type of maintenance operation based at least in part on the ranking of the subset of the plurality of zones for the first type of maintenance operation, where the zone is selected based at least in part on updating the ranking.

In some examples, the subset of the plurality of zones is associated with a highest priority for the first type of maintenance operation, and the controller 525 may be configured as or otherwise support a means for determining that the zone is excluded from the subset of the plurality of zones, where the zone is selected for the second type of maintenance operation based at least in part on the determination.

In some examples, the subset of the plurality of zones is associated with a highest priority for the first type of maintenance operation, and the controller 525 may be configured as or otherwise support a means for determining that a second zone is included in the subset of the plurality of zones. In some examples, the subset of the plurality of zones is associated with a highest priority for the first type of maintenance operation, and the controller 525 may be configured as or otherwise support a means for deprioritizing the second zone for the second type of maintenance operation based at least in part on the determination.

Figure 6:
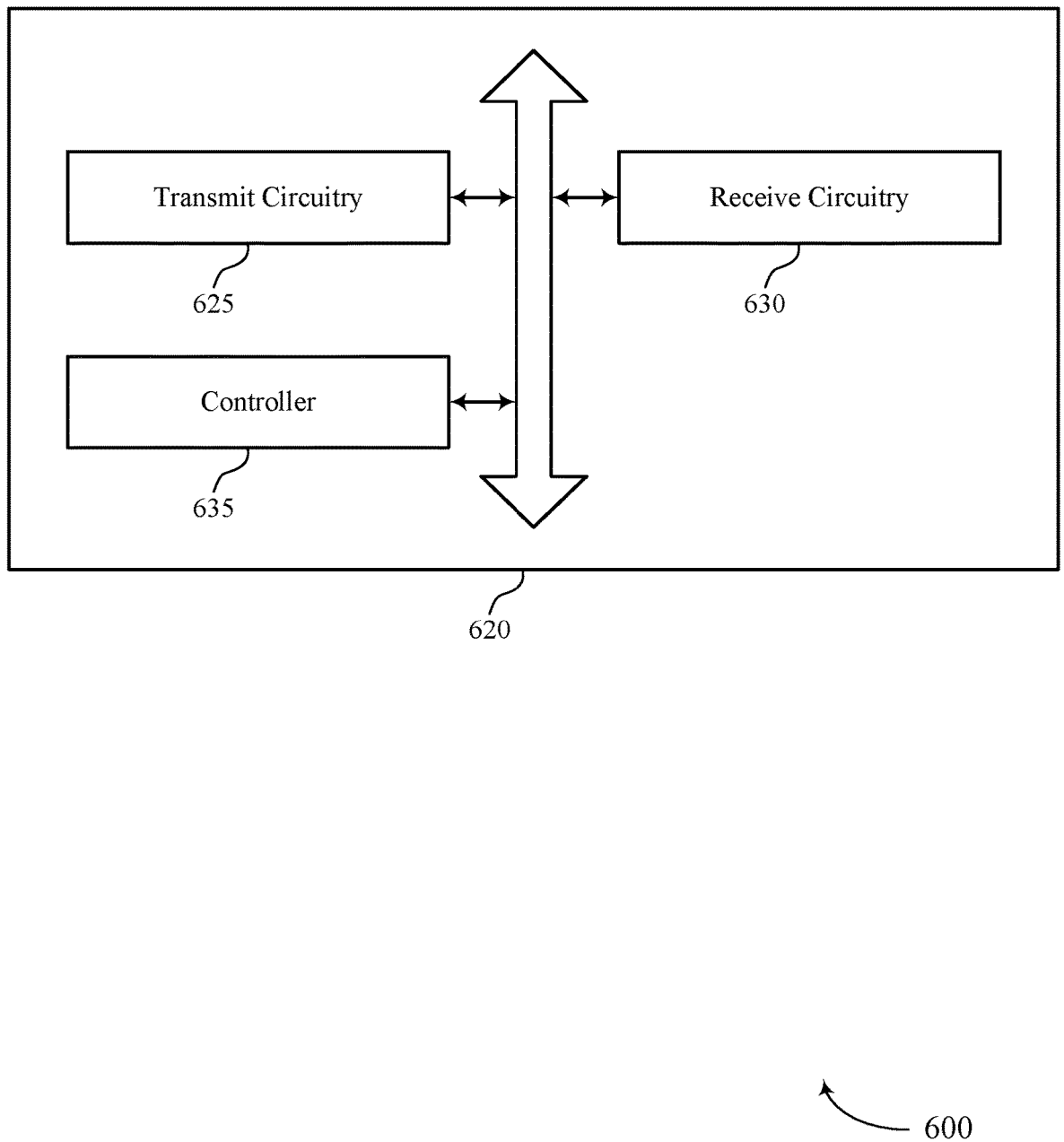
FIG. 6 shows a block diagram of a host system that supports signaling memory zone ranking information in accordance with examples as disclosed herein.

FIG. 6 shows a block diagram 600 of a host system 620 that supports signaling memory zone ranking information in accordance with examples as disclosed herein. The host system 620 may be an example of aspects of a host system as described with reference to FIGS. 1 through 4. The host system 620, or various components thereof, may be an example of means for performing various aspects of signaling memory zone ranking information as described herein. For example, the host system 620 may include a transmit circuitry 625, a receive circuitry 630, a controller 635, or any combination thereof. Each of these components may communicate, directly or indirectly, with one another (e.g., via one or more buses).

The transmit circuitry 625 may be configured as or otherwise support a means for transmitting a request for ranking information for a plurality of zones of a memory system, where each zone of the plurality includes memory cells corresponding to a respective set of addresses. The receive circuitry 630 may be configured as or otherwise support a means for receiving the ranking information based at least in part on transmitting the request for the ranking information, where the ranking information indicates a ranking of at least a subset of the plurality of zones for a first type of maintenance operation. The controller 635 may be configured as or otherwise support a means for selecting a zone of the plurality of zones for a second type of maintenance operation based at least in part on the ranking information.

In some examples, the first type of maintenance operation includes a refresh operation. In some examples, the second type of maintenance operation includes a garbage collection operation.

In some examples, the controller 635 may be configured as or otherwise support a means for determining, based at least in part on the ranking information, that the zone is in the subset of the plurality of zones with a highest priority for the first type of maintenance operation, where the zone is selected based at least in part on the determination.

In some examples, the transmit circuitry 625 may be configured as or otherwise support a means for transmitting, before the memory system performs the first type of maintenance operation on the zone, a command for the memory system to perform the second type of maintenance operation on the zone.

In some examples, the subset of the plurality of zones is associated with a highest priority for the first type of maintenance operation, and the controller 635 may be configured as or otherwise support a means for determining that the subset of the plurality of zones excludes a second zone of the plurality of zones. In some examples, the subset of the plurality of zones is associated with a highest priority for the first type of maintenance operation, and the controller 635 may be configured as or otherwise support a means for prioritizing, for the second type of maintenance operation, selection of the zone over the second zone based at least in part on the determination.

In some examples, the controller 635 may be configured as or otherwise support a means for determining validity information for a plurality of zones of a memory system, where each zone of the plurality of zones includes memory cells corresponding to a respective set of addresses, and where the validity information for a zone indicates an amount of data in that zone with a first validity status. In some examples, the controller 635 may be configured as or otherwise support a means for determining a ranking of at least a subset of the plurality of zones based at least in part on the validity information for the plurality of zones. In some examples, the transmit circuitry 625 may be configured as or otherwise support a means for transmitting ranking information for the subset of the plurality of zones, where the ranking information indicates the ranking for the subset of the plurality of zones.

In some examples, the ranking of the subset of the plurality of zones indicates an order of the subset of the plurality of zones according to respective quantities of data with the first validity status. In some examples, the ranking of the subset of the plurality of zones indicates a predicted order for performing a type of maintenance operation on the subset of the plurality of zones.

In some examples, the transmit circuitry 625 may be configured as or otherwise support a means for transmitting a command for the memory system to perform the type of maintenance operation on a zone of the subset of the plurality of zones based at least in part on the ranking.

In some examples, the receive circuitry 630 may be configured as or otherwise support a means for receiving second ranking information for at least a second subset of the plurality of zones, the second ranking information for a second type of maintenance operation. In some examples, the controller 635 may be configured as or otherwise support a means for updating the ranking of the plurality of zones based at least in part on the second ranking information.

Figure 7:
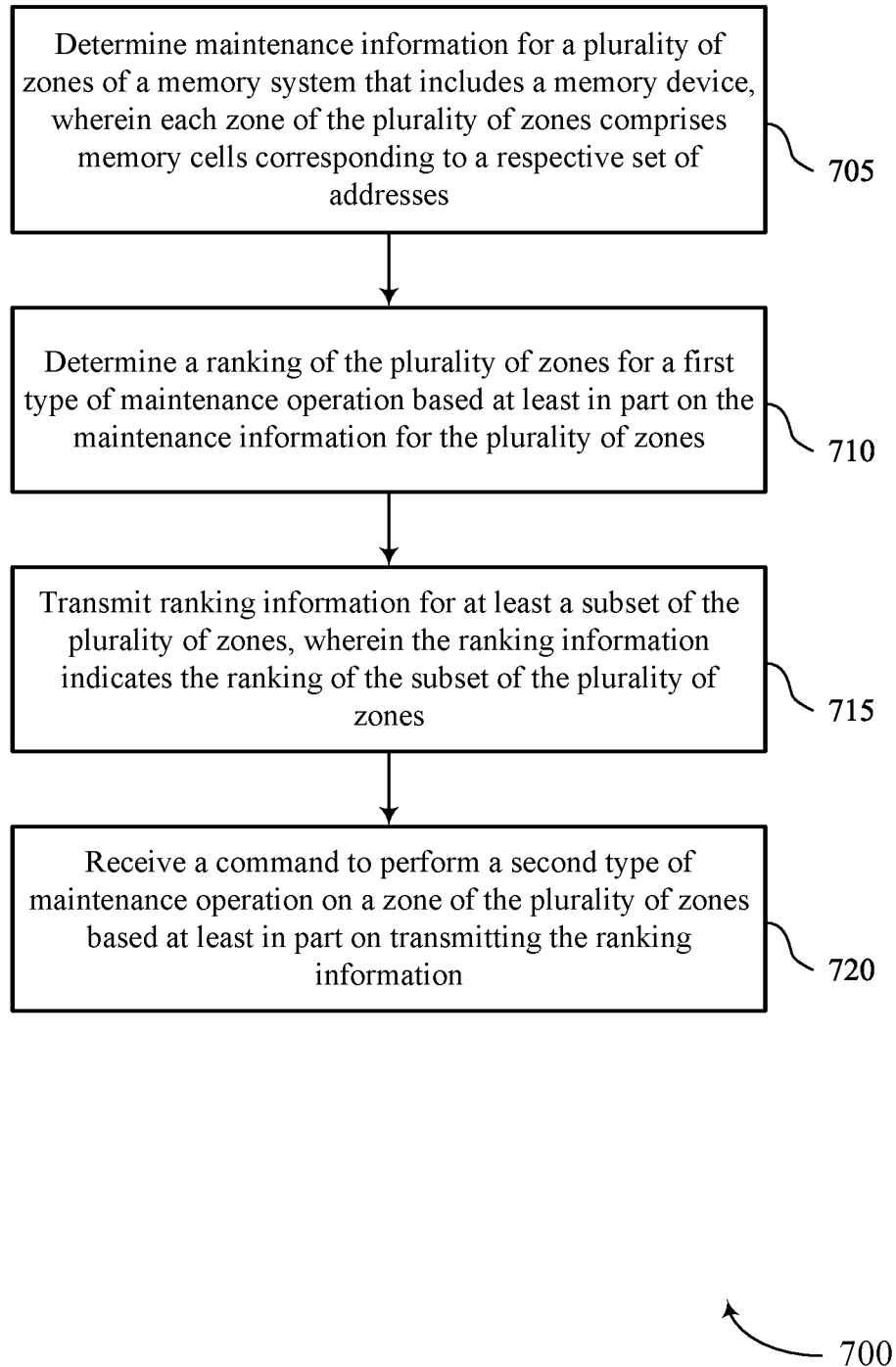
FIGS. 7 through 10 show flowcharts illustrating a method or methods that support signaling memory zone ranking information in accordance with examples as disclosed herein.

FIG. 7 shows a flowchart illustrating a method 700 that supports signaling memory zone ranking information in accordance with examples as disclosed herein. The operations of method 700 may be implemented by a memory system or its components as described herein. For example, the operations of method 700 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 705, the method may include determining maintenance information for a plurality of zones of a memory system that includes a memory device, where each zone of the plurality of zones includes memory cells corresponding to a respective set of addresses. The operations of 705 may be performed in accordance with examples as disclosed herein. In some examples, aspects of the operations of 705 may be performed by a controller 525 as described with reference to FIG. 5.

At 710, the method may include determining a ranking of the plurality of zones for a first type of maintenance operation based at least in part on the maintenance information for the plurality of zones. The operations of 710 may be performed in accordance with examples as disclosed herein. In some examples, aspects of the operations of 710 may be performed by a controller 525 as described with reference to FIG. 5.

At 715, the method may include transmitting ranking information for at least a subset of the plurality of zones, where the ranking information indicates the ranking of the at least the subset of the plurality of zones. The operations of 715 may be performed in accordance with examples as disclosed herein. In some examples, aspects of the operations of 715 may be performed by a transmit circuitry 530 as described with reference to FIG. 5.

At 720, the method may include receiving a command to perform a second type of maintenance operation on a zone of the plurality of zones based at least in part on transmitting the ranking information. The operations of 720 may be performed in accordance with examples as disclosed herein. In some examples, aspects of the operations of 720 may be performed by a receive circuitry 535 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for determining maintenance information for a plurality of zones of a memory system that includes a memory device, where each zone of the plurality of zones includes memory cells corresponding to a respective set of addresses; determining a ranking of the plurality of zones for a first type of maintenance operation based at least in part on the maintenance information for the plurality of zones; transmitting ranking information for at least a subset of the plurality of zones, where the ranking information indicates the ranking of the at least the subset of the plurality of zones; and receiving a command to perform a second type of maintenance operation on a zone of the plurality of zones based at least in part on transmitting the ranking information.

Aspect 2: The method, apparatus, or non-transitory computer-readable medium of aspect 1 where the first type of maintenance operation includes a refresh operation in which data from a zone is re-written to the zone or written to another zone and the second type of maintenance operation includes a garbage collection operation in which valid data from a zone is written to a different zone.

Aspect 3: The method, apparatus, or non-transitory computer-readable medium of any of aspects 1 through 2 where the ranking information indicates a predicted order for performing the first type of maintenance operation on the plurality of zones.

Aspect 4: The method, apparatus, or non-transitory computer-readable medium of any of aspects 1 through 3, further including operations, features, circuitry, logic, means, or instructions, or any combination thereof for receiving a request for the ranking information, where the ranking information is transmitted based at least in part on receiving the request.

Aspect 5: The method, apparatus, or non-transitory computer-readable medium of aspect 4 where the request for the ranking information is received after determining the ranking of the plurality of zones.

Aspect 6: The method, apparatus, or non-transitory computer-readable medium of any of aspects 1 through 5, further including operations, features, circuitry, logic, means, or instructions, or any combination thereof for performing the second type of maintenance operation on the zone based at least in part on receiving the command and adjusting a ranking of the zone for the first type of maintenance operation based at least in part on performing the second type of maintenance operation.

Aspect 7: The method, apparatus, or non-transitory computer-readable medium of any of aspects 1 through 6 where the maintenance information for a zone includes read disturb information that indicates a quantity of read operations performed on the zone since performance of a write operation or a refresh operation on the zone, retention status information that indicates a duration of time since performance of a write operation or a refresh operation on the zone, temperature information that indicates a temperature for a write operation performed on the zone, or a combination thereof.

Aspect 8: The method, apparatus, or non-transitory computer-readable medium of any of aspects 1 through 7, further including operations, features, circuitry, logic, means, or instructions, or any combination thereof for receiving second ranking information for at least a second subset of the plurality of zones, the second ranking information for the second type of maintenance operation and updating the ranking of the plurality of zones for the first type of maintenance operation based at least in part on the second ranking information.

Figure 8:
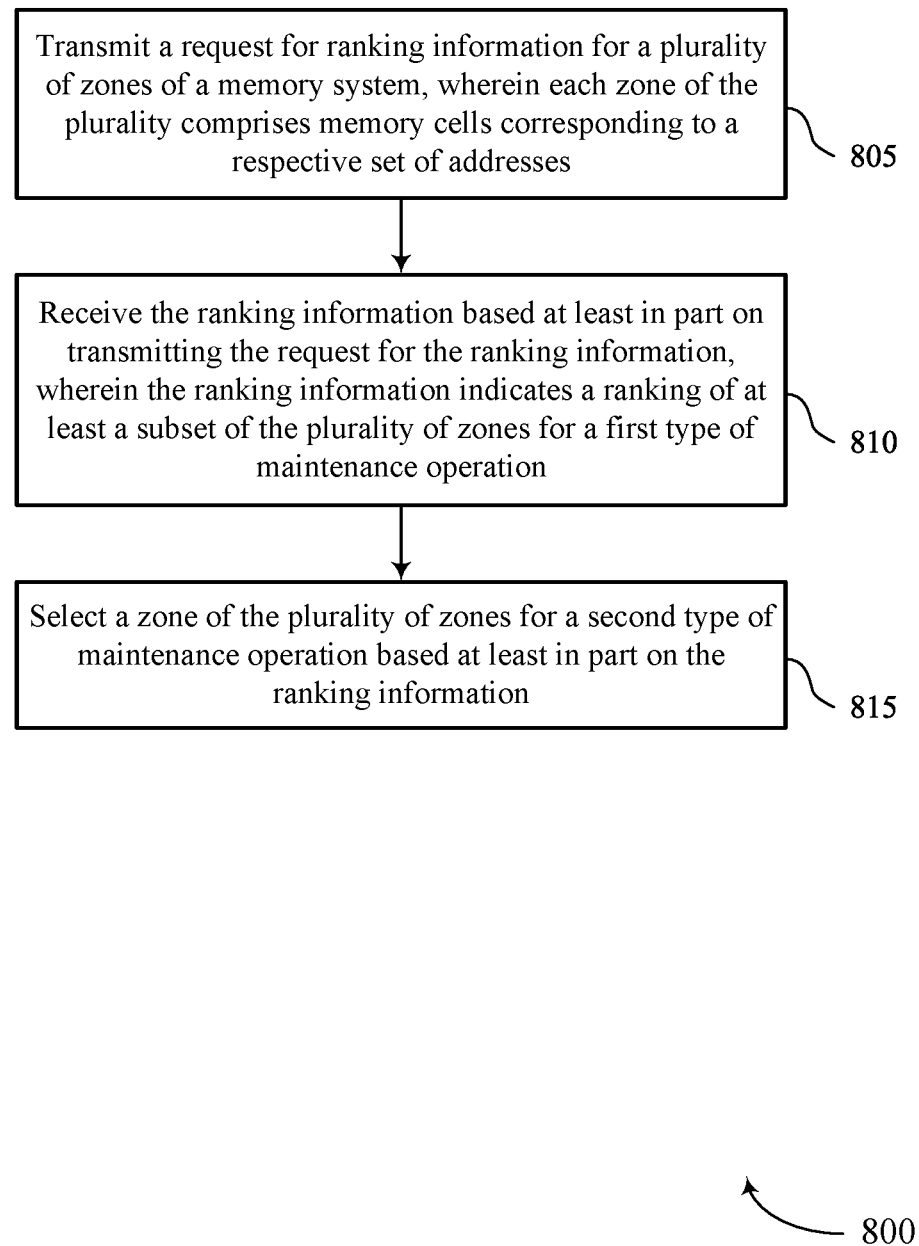

FIG. 8 shows a flowchart illustrating a method 800 that supports signaling memory zone ranking information in accordance with examples as disclosed herein. The operations of method 800 may be implemented by a host system or its components as described herein. For example, the operations of method 800 may be performed by a host system as described with reference to FIGS. 1 through 4 and 6. In some examples, a host system may execute a set of instructions to control the functional elements of the device to perform the described functions. Additionally, or alternatively, the host system may perform aspects of the described functions using special-purpose hardware.

At 805, the method may include transmitting a request for ranking information for a plurality of zones of a memory system, where each zone of the plurality includes memory cells corresponding to a respective set of addresses. The operations of 805 may be performed in accordance with examples as disclosed herein. In some examples, aspects of the operations of 805 may be performed by a transmit circuitry 625 as described with reference to FIG. 6.

At 810, the method may include receiving the ranking information based at least in part on transmitting the request for the ranking information, where the ranking information indicates a ranking of at least a subset of the plurality of zones for a first type of maintenance operation. The operations of 810 may be performed in accordance with examples as disclosed herein. In some examples, aspects of the operations of 810 may be performed by a receive circuitry 630 as described with reference to FIG. 6.

At 815, the method may include selecting a zone of the plurality of zones for a second type of maintenance operation based at least in part on the ranking information. The operations of 815 may be performed in accordance with examples as disclosed herein. In some examples, aspects of the operations of 815 may be performed by a controller 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 9: A method, apparatus, or non-transitory computer-readable medium including operations, features, circuitry, logic, means, or instructions, or any combination thereof for transmitting a request for ranking information for a plurality of zones of a memory system, where each zone of the plurality includes memory cells corresponding to a respective set of addresses; receiving the ranking information based at least in part on transmitting the request for the ranking information, where the ranking information indicates a ranking of at least a subset of the plurality of zones for a first type of maintenance operation; and selecting a zone of the plurality of zones for a second type of maintenance operation based at least in part on the ranking information.

Aspect 10: The method, apparatus, or non-transitory computer-readable medium of aspect 9 where the first type of maintenance operation includes a refresh operation and the second type of maintenance operation includes a garbage collection operation.

Aspect 11: The method, apparatus, or non-transitory computer-readable medium of any of aspects 9 through 10, further including operations, features, circuitry, logic, means, or instructions, or any combination thereof for determining, based at least in part on the ranking information, that the zone is in the subset of the plurality of zones with a highest priority for the first type of maintenance operation, where the zone is selected based at least in part on the determination.

Aspect 12: The method, apparatus, or non-transitory computer-readable medium of aspect 11, further including operations, features, circuitry, logic, means, or instructions, or any combination thereof for transmitting, before the memory system performs the first type of maintenance operation on the zone, a command for the memory system to perform the second type of maintenance operation on the zone.

Aspect 13: The method, apparatus, or non-transitory computer-readable medium of any of aspects 9 through 12 where the subset of the plurality of zones is associated with a highest priority for the first type of maintenance operation and the method, apparatuses, and non-transitory computer-readable medium, further includes operations, features, circuitry, logic, means, or instructions, or any combination thereof for determining that the subset of the plurality of zones excludes a second zone of the plurality of zones and prioritizing, for the second type of maintenance operation, selection of the zone over the second zone based at least in part on the determination.

Figure 9:
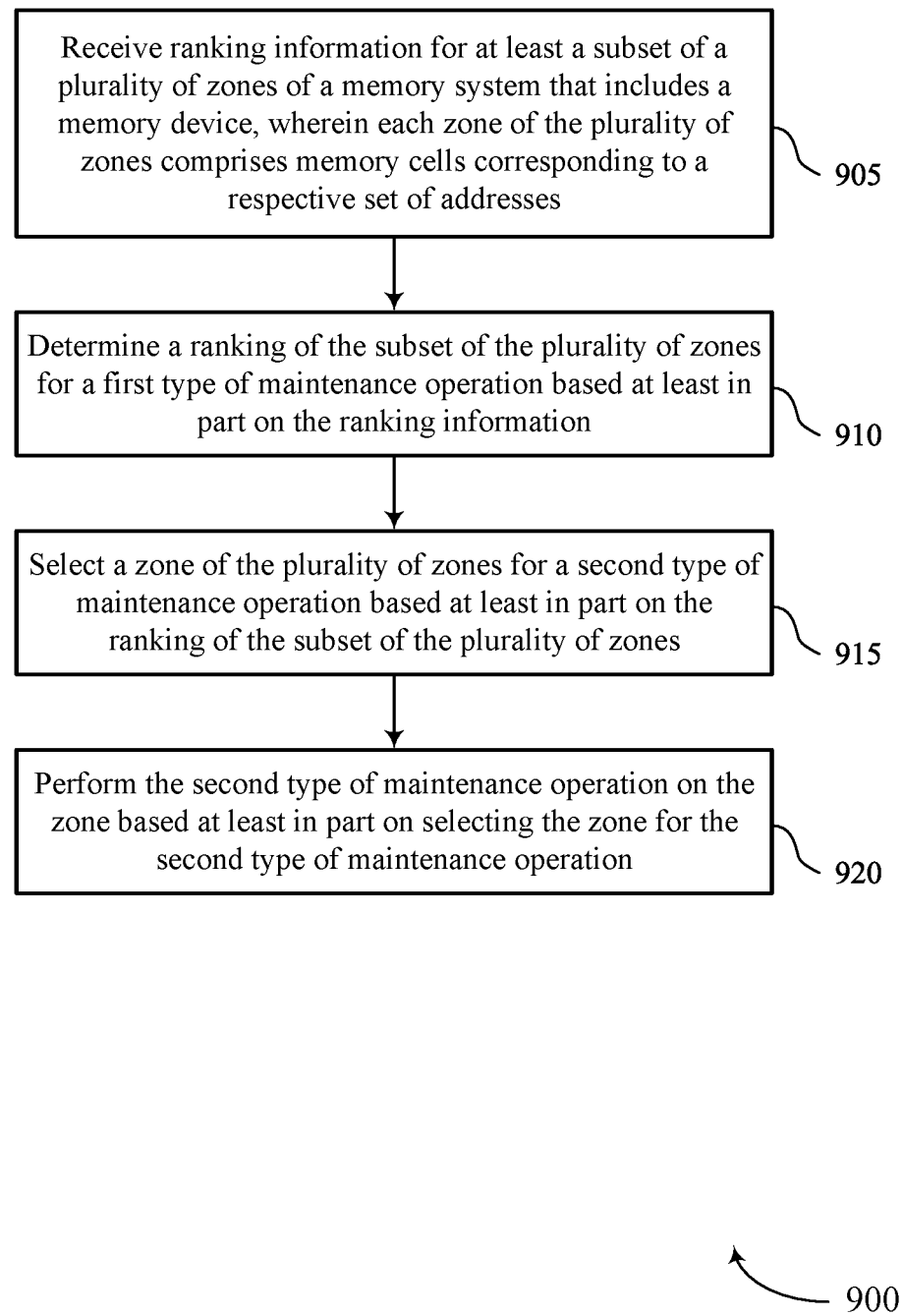

FIG. 9 shows a flowchart illustrating a method 900 that supports signaling memory zone ranking information in accordance with examples as disclosed herein. The operations of method 900 may be implemented by a memory system or its components as described herein. For example, the operations of method 900 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 905, the method may include receiving ranking information for at least a subset of a plurality of zones of a memory system that includes a memory device, where each zone of the plurality of zones includes memory cells corresponding to a respective set of addresses. The operations of 905 may be performed in accordance with examples as disclosed herein. In some examples, aspects of the operations of 905 may be performed by a receive circuitry 535 as described with reference to FIG. 5.

At 910, the method may include determining a ranking of the subset of the plurality of zones for a first type of maintenance operation based at least in part on the ranking information. The operations of 910 may be performed in accordance with examples as disclosed herein. In some examples, aspects of the operations of 910 may be performed by a controller 525 as described with reference to FIG. 5.

At 915, the method may include selecting a zone of the plurality of zones for a second type of maintenance operation based at least in part on the ranking of the subset of the plurality of zones. The operations of 915 may be performed in accordance with examples as disclosed herein. In some examples, aspects of the operations of 915 may be performed by a controller 525 as described with reference to FIG. 5.

At 920, the method may include performing the second type of maintenance operation on the zone based at least in part on selecting the zone for the second type of maintenance operation. The operations of 920 may be performed in accordance with examples as disclosed herein. In some examples, aspects of the operations of 920 may be performed by an access circuitry 540 as described with reference to FIG. 5.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 14: A method, apparatus, or non-transitory computer-readable medium including operations, features, circuitry, logic, means, or instructions, or any combination thereof for receiving ranking information for at least a subset of a plurality of zones of a memory system that includes a memory device, where each zone of the plurality of zones includes memory cells corresponding to a respective set of addresses; determining a ranking of the subset of the plurality of zones for a first type of maintenance operation based at least in part on the ranking information; selecting a zone of the plurality of zones for a second type of maintenance operation based at least in part on the ranking of the subset of the plurality of zones; and performing the second type of maintenance operation on the zone based at least in part on selecting the zone for the second type of maintenance operation.

Aspect 15: The method, apparatus, or non-transitory computer-readable medium of aspect 14 where the ranking information indicates a predicted order for performing the first type of maintenance operation on the subset of the plurality of zones.

Aspect 16: The method, apparatus, or non-transitory computer-readable medium of any of aspects 14 through 15 where the ranking information includes validity information that indicates, for each zone of the subset of the plurality of zones, an amount data with a first validity status.

Aspect 17: The method, apparatus, or non-transitory computer-readable medium of any of aspects 14 through 16, further including operations, features, circuitry, logic, means, or instructions, or any combination thereof for updating a ranking of the plurality of zones for the second type of maintenance operation based at least in part on the ranking of the subset of the plurality of zones for the first type of maintenance operation, where the zone is selected based at least in part on updating the ranking.

Aspect 18: The method, apparatus, or non-transitory computer-readable medium of any of aspects 14 through 17 where the subset of the plurality of zones is associated with a highest priority for the first type of maintenance operation and the method, apparatuses, and non-transitory computer-readable medium, further includes operations, features, circuitry, logic, means, or instructions, or any combination thereof for determining that the zone is excluded from the subset of the plurality of zones, where the zone is selected for the second type of maintenance operation based at least in part on the determination.

Aspect 19: The method, apparatus, or non-transitory computer-readable medium of any of aspects 14 through 18 where the subset of the plurality of zones is associated with a highest priority for the first type of maintenance operation and the method, apparatuses, and non-transitory computer-readable medium, further includes operations, features, circuitry, logic, means, or instructions, or any combination thereof for determining that a second zone is included in the subset of the plurality of zones and deprioritizing the second zone for the second type of maintenance operation based at least in part on the determination.

Figure 10:
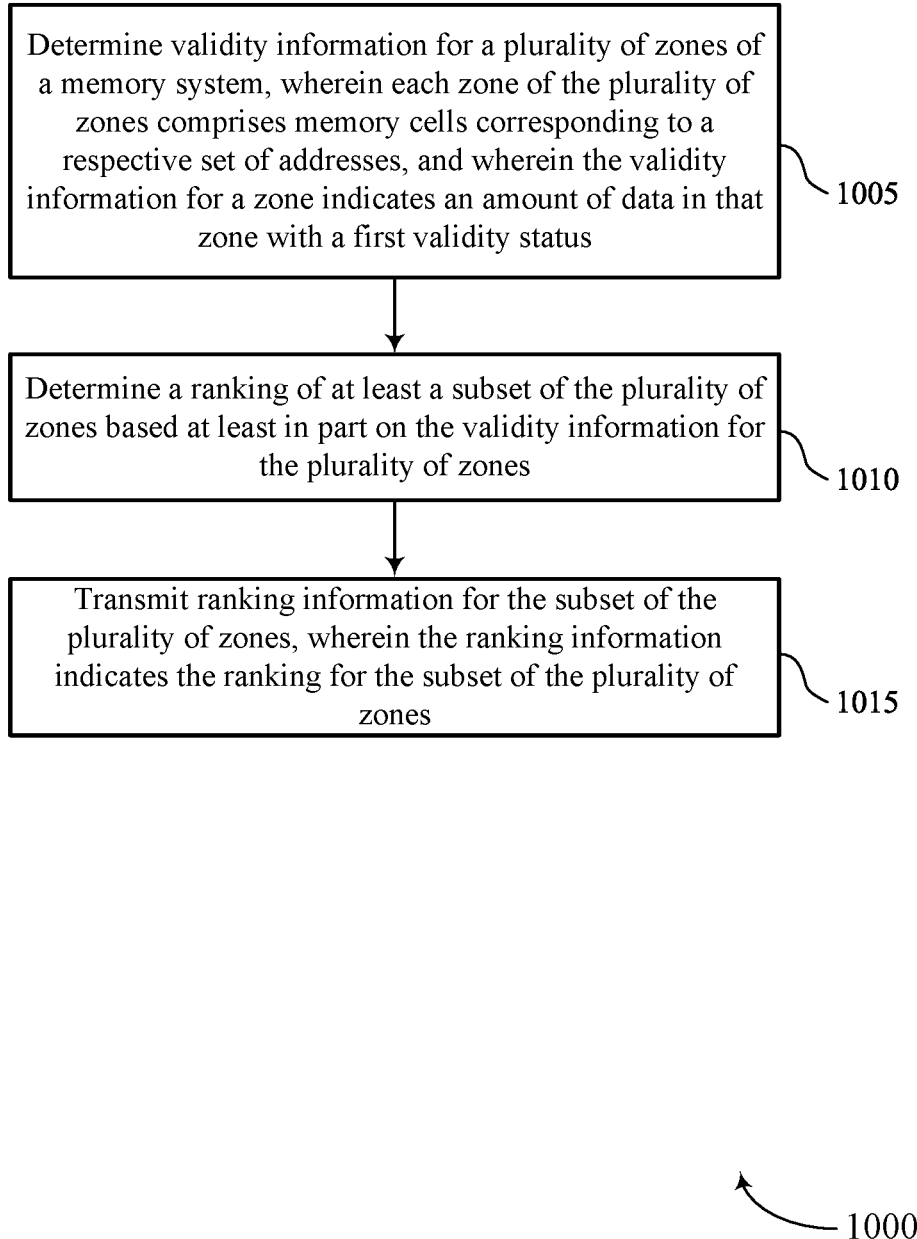

FIG. 10 shows a flowchart illustrating a method 1000 that supports signaling memory zone ranking information in accordance with examples as disclosed herein. The operations of method 1000 may be implemented by a host system or its components as described herein. For example, the operations of method 1000 may be performed by a host system as described with reference to FIGS. 1 through 4 and 6. In some examples, a host system may execute a set of instructions to control the functional elements of the device to perform the described functions. Additionally, or alternatively, the host system may perform aspects of the described functions using special-purpose hardware.

At 1005, the method may include determining validity information for a plurality of zones of a memory system, where each zone of the plurality of zones includes memory cells corresponding to a respective set of addresses, and where the validity information for a zone indicates an amount of data in that zone with a first validity status. The operations of 1005 may be performed in accordance with examples as disclosed herein. In some examples, aspects of the operations of 1005 may be performed by a controller 635 as described with reference to FIG. 6.

At 1010, the method may include determining a ranking of at least a subset of the plurality of zones based at least in part on the validity information for the plurality of zones. The operations of 1010 may be performed in accordance with examples as disclosed herein. In some examples, aspects of the operations of 1010 may be performed by a controller 635 as described with reference to FIG. 6.

At 1015, the method may include transmitting ranking information for the subset of the plurality of zones, where the ranking information indicates the ranking for the subset of the plurality of zones. The operations of 1015 may be performed in accordance with examples as disclosed herein. In some examples, aspects of the operations of 1015 may be performed by a transmit circuitry 625 as described with reference to FIG. 6.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 20: A method, apparatus, or non-transitory computer-readable medium including operations, features, circuitry, logic, means, or instructions, or any combination thereof for determining validity information for a plurality of zones of a memory system, where each zone of the plurality of zones includes memory cells corresponding to a respective set of addresses, and where the validity information for a zone indicates an amount of data in that zone with a first validity status; determining a ranking of at least a subset of the plurality of zones based at least in part on the validity information for the plurality of zones; and transmitting ranking information for the subset of the plurality of zones, where the ranking information indicates the ranking for the subset of the plurality of zones.

Aspect 21: The method, apparatus, or non-transitory computer-readable medium of aspect 20 where the ranking of the subset of the plurality of zones indicates an order of the subset of the plurality of zones according to respective quantities of data with the first validity status.

Aspect 22: The method, apparatus, or non-transitory computer-readable medium of any of aspects 20 through 21 where the ranking of the subset of the plurality of zones indicates a predicted order for performing a type of maintenance operation on the subset of the plurality of zones.

Aspect 23: The method, apparatus, or non-transitory computer-readable medium of aspect 22, further including operations, features, circuitry, logic, means, or instructions, or any combination thereof for transmitting a command for the memory system to perform the type of maintenance operation on a zone of the subset of the plurality of zones based at least in part on the ranking.

Aspect 24: The method, apparatus, or non-transitory computer-readable medium of any of aspects 22 through 23, further including operations, features, circuitry, logic, means, or instructions, or any combination thereof for receiving second ranking information for at least a second subset of the plurality of zones, the second ranking information for a second type of maintenance operation and updating the ranking of the plurality of zones based at least in part on the second ranking information.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory device; and
a controller coupled with the memory device and configured to cause the apparatus to:
determine maintenance information for a plurality of zones of a memory system that includes the memory device, wherein each zone of the plurality of zones comprises memory cells corresponding to a respective set of addresses;
determine a ranking of the plurality of zones for a first type of maintenance operation based at least in part on the maintenance information for the plurality of zones;
transmit ranking information for at least a subset of the plurality of zones, wherein the ranking information indicates the ranking of the subset of the plurality of zones; and receive a command to perform a second type of maintenance operation on a zone of the plurality of zones based at least in part on transmitting the ranking information.

2. The apparatus of claim 1, wherein the first type of maintenance operation comprises a refresh operation in which data from a zone is re-written to the zone or written to another zone, and wherein the second type of maintenance operation comprises a garbage collection operation in which valid data from a zone is written to a different zone.

3. The apparatus of claim 1, wherein the ranking information indicates a predicted order for performing the first type of maintenance operation on the plurality of zones.

4. The apparatus of claim 1, wherein the controller is further configured to:
receive a request for the ranking information, wherein the ranking information is transmitted based at least in part on receiving the request.

5. The apparatus of claim 4, wherein the request for the ranking information is received after determining the ranking of the plurality of zones.

6. The apparatus of claim 1, wherein the controller is further configured to:
perform the second type of maintenance operation on the zone based at least in part on receiving the command; and
adjust a ranking of the zone for the first type of maintenance operation based at least in part on performing the second type of maintenance operation.

7. The apparatus of claim 1, wherein the maintenance information for a zone comprises: read disturb information that indicates a quantity of read operations performed on the zone since performance of a write operation or a refresh operation on the zone, retention status information that indicates a duration of time since performance of a write operation or a refresh operation on the zone, temperature information that indicates a temperature for a write operation performed on the zone, or a combination thereof.

8. The apparatus of claim 1, wherein the controller is further configured to cause the apparatus to:
receive second ranking information for at least a second subset of the plurality of zones, the second ranking information for the second type of maintenance operation; and
update the ranking of the plurality of zones for the first type of maintenance operation based at least in part on the second ranking information.

9. An apparatus, comprising:
a controller coupled with a memory system and configured to cause the apparatus to:
transmit a request for ranking information for a plurality of zones of the memory system, wherein each zone of the plurality of zones comprises memory cells corresponding to a respective set of addresses;
receive the ranking information based at least in part on transmitting the request for the ranking information, wherein the ranking information indicates a ranking of at least a subset of the plurality of zones for a first type of maintenance operation; and
select a zone of the plurality of zones for a second type of maintenance operation based at least in part on the ranking information.

10. The apparatus of claim 9, wherein the first type of maintenance operation comprises a refresh operation, and wherein the second type of maintenance operation comprises a garbage collection operation.

11. The apparatus of claim 9, wherein the controller is further configured to cause the apparatus to:
determine, based at least in part on the ranking information, that the zone is in the subset of the plurality of zones with a highest priority for the first type of maintenance operation, wherein the zone is selected based at least in part on the determination.

12. The apparatus of claim 11, wherein the controller is further configured to cause the apparatus to:
transmit, before the memory system performs the first type of maintenance operation on the zone, a command for the memory system to perform the second type of maintenance operation on the zone.

13. The apparatus of claim 9, wherein the subset of the plurality of zones is associated with a highest priority for the first type of maintenance operation, and wherein the controller is further configured to cause the apparatus to:
determine that the subset of the plurality of zones excludes a second zone of the plurality of zones; and
prioritize, for the second type of maintenance operation, selection of the zone over the second zone based at least in part on the determination.

14. An apparatus, comprising:
a memory device; and
a controller coupled with the memory device and configured to cause the apparatus to:
receive ranking information for at least a subset of a plurality of zones of a memory system that includes the memory device, wherein each zone of the plurality of zones comprises memory cells corresponding to a respective set of addresses;
determine a ranking of the subset of the plurality of zones for a first type of maintenance operation based at least in part on the ranking information;
select a zone of the plurality of zones for a second type of maintenance operation based at least in part on the ranking of the subset of the plurality of zones; and
perform the second type of maintenance operation on the zone based at least in part on selecting the zone for the second type of maintenance operation.

15. The apparatus of claim 14, wherein the ranking information indicates a predicted order for performing the first type of maintenance operation on the subset of the plurality of zones.

16. The apparatus of claim 14, wherein the ranking information comprises validity information that indicates, for each zone of the subset of the plurality of zones, an amount data with a first validity status.

17. The apparatus of claim 14, wherein the controller is further configured to cause the apparatus to:
update a ranking of the plurality of zones for the second type of maintenance operation based at least in part on the ranking of the subset of the plurality of zones for the first type of maintenance operation, wherein the zone is selected based at least in part on updating the ranking.

18. The apparatus of claim 14, wherein the subset of the plurality of zones is associated with a highest priority for the first type of maintenance operation, and wherein the controller is further configured to cause the apparatus to:
determine that the zone is excluded from the subset of the plurality of zones, wherein the zone is selected for the second type of maintenance operation based at least in part on the determination.

19. The apparatus of claim 14, wherein the subset of the plurality of zones is associated with a highest priority for the first type of maintenance operation, and wherein the controller is further configured to cause the apparatus to:

determine that a second zone is included in the subset of the plurality of zones; and deprioritize the second zone for the second type of maintenance operation based at least in part on the determination.

20. An apparatus, comprising:

a controller coupled with a memory system and configured to cause the apparatus to:

determine validity information for a plurality of zones of the memory system, wherein each zone of the plurality of zones comprises memory cells corresponding to a respective set of addresses, and wherein the validity information for a zone indicates an amount of data in that zone with a first validity status;

determine a ranking of at least a subset of the plurality of zones based at least in part on the validity information for the plurality of zones; and transmit ranking information for the subset of the plurality of zones, wherein the ranking information indicates the ranking for the subset of the plurality of zones.

* * * * *